(12) United States Patent
Moon et al.

(10) Patent No.: US 10,873,054 B2
(45) Date of Patent: Dec. 22, 2020

(54) DISPLAY APPARATUS

(71) Applicant: Samsung Display Co., Ltd., Yongin-Si (KR)

(72) Inventors: Byungrok Moon, Asan-si (KR); Jaehyun Kim, Suwon-si (KR); Seokhoon Seo, Asan-si (KR); Seungwoo Seo, Asan-si (KR)

(73) Assignee: Samsung Display Co., Ltd., Yongin-si ( * ) Notice: Subject to any disclaimer, the term of this patent is extended or adjusted under 35 U.S.C. 154(b) by 0 days.

(21) Appl. No.: 16/257,957

(22) Filed: Jan. 25, 2019

(65) Prior Publication Data

US 2019/0237704 A1 Aug. 1, 2019

(30) Foreign Application Priority Data

Jan. 26, 2018 (KR) .................. 10-2018-0009990

(51) Int. Cl.
| | |
|---|---|
| *G06F 3/045* | (2006.01) |
| *H01L 51/52* | (2006.01) |
| *H01L 27/32* | (2006.01) |
| *G06F 3/044* | (2006.01) |
| *G06F 3/041* | (2006.01) |
| *G06F 3/046* | (2006.01) |

(52) U.S. Cl.
CPC .......... *H01L 51/5256* (2013.01); *G06F 3/044* (2013.01); *H01L 27/323* (2013.01); *H01L 27/3246* (2013.01); *G06F 3/046* (2013.01); *G06F 3/0414* (2013.01); *H01L 27/3211* (2013.01); *H01L 27/3244* (2013.01); *H01L 27/3276* (2013.01); *H01L 51/5206* (2013.01); *H01L 51/5221* (2013.01); *H01L 2251/303* (2013.01); *H01L 2251/558* (2013.01)

(58) Field of Classification Search
USPC ........... 257/40; 345/174, 690, 691, 204, 208
See application file for complete search history.

(56) References Cited

U.S. PATENT DOCUMENTS

| | | | |
|---|---|---|---|
| 9,627,647 B2 | 4/2017 | Kim et al. | |
| 2015/0102310 A1* | 4/2015 | Diez ................... | H01L 51/5278 257/40 |
| 2015/0200370 A1* | 7/2015 | Unnikrishnan ..... | H01L 51/4293 257/40 |
| 2016/0020431 A1* | 1/2016 | Yamae ................ | H01L 27/3209 257/40 |
| 2016/0035991 A1* | 2/2016 | Yamae ................ | H01L 51/5004 257/40 |
| 2016/0042916 A1 | 2/2016 | Wang | |

(Continued)

FOREIGN PATENT DOCUMENTS

| | | |
|---|---|---|
| KR | 10-2016-0036722 | 4/2016 |
| KR | 10-2016-0065553 | 6/2016 |
| KR | 10-2017-0012696 | 2/2017 |

*Primary Examiner* — Thuy N Pardo
(74) *Attorney, Agent, or Firm* — H.C. Park & Associates, PLC (57) ABSTRACT

A display device including a light emitting device and an encapsulation member provided on the light emitting device to seal the light emitting device. The encapsulation member may include an organic layer and at least one inorganic layer. An extinction coefficient of the inorganic layer to light having a wavelength range of about 390-430 nm may range from about 0.0052 to about 0.0085.

20 Claims, 6 Drawing Sheets

(56) References Cited

U.S. PATENT DOCUMENTS

| | | | |
|---|---|---|---|
| 2016/0093828 A1* | 3/2016 | Kim | H01L 51/5253 257/40 |
| 2016/0155975 A1 | 6/2016 | Jin et al. | |
| 2017/0018733 A1* | 1/2017 | Jin | H01L 51/5253 345/690 |
| 2017/0023718 A1 | 1/2017 | Son et al. | |
| 2017/0213999 A1* | 7/2017 | Kim | H01L 51/5253 345/174 |
| 2018/0046005 A1* | 2/2018 | Yoon | G06F 1/1652 345/174 |
| 2018/0108858 A1* | 4/2018 | Ito | H01L 51/0039 345/174 |
| 2018/0151627 A1* | 5/2018 | Seo | G06F 3/044 345/204 |

* cited by examiner

DISPLAY APPARATUS

CROSS-REFERENCE TO RELATED APPLICATIONS

This application claims priority from and the benefit of Korean Patent Application No. 10-2018-0009990, filed on Jan. 26, 2018, which is hereby incorporated by reference for all purposes as if fully set forth herein.

BACKGROUND

Field

Exemplary embodiments of the invention relate generally to a display apparatus, and, more specifically, to a display apparatus having an improved display quality.

Discussion of the Background

A light emitting display apparatus includes a light emitting device, which is composed of an anode, a light emitting layer, and a cathode. The light emitting layer is very vulnerable to moisture or oxygen. For example, in the case where external moisture or oxygen is infiltrated into the light emitting display apparatus, the light emitting layer is deteriorated to cause various failures, such as dark spot and pixel shrinkage. Thus, an encapsulation structure is used to protect the light emitting device.

The above information disclosed in this Background section is only for understanding of the background of the inventive concepts, and, therefore, it may contain information that does not constitute prior art.

SUMMARY

The inventive concepts provide a display apparatus having an improved display quality and life span.

Additional features of the inventive concepts will be set forth in the description which follows, and in part will be apparent from the description, or may be learned by practice of the inventive concepts.

According to an exemplary embodiment of the inventive concepts, a display device may include a light emitting device and an encapsulation member provided on the light emitting device to seal the light emitting device. The encapsulation member may include an organic layer and at least one inorganic layer. An extinction coefficient of the inorganic layer to light having a wavelength range of about 390-430 nm may range from about 0.0052 to about 0.0085.

In an exemplary embodiment, an extinction coefficient of the inorganic layer to light having a wavelength range of about 430 nm or longer may be less than or equal to about 0.004.

In an exemplary embodiment, a refractive index of the inorganic layer to light having a wavelength range of about 390-430 nm may range from about 1.774 to about 1.778.

In an exemplary embodiment, the inorganic layer may include a silicon-based material.

In an exemplary embodiment, the inorganic layer may be provided in plurality. The plurality of inorganic layers may include a lower encapsulation layer between the light emitting device and the organic layer, and an upper encapsulation layer facing the lower encapsulation layer with the organic layer interposed therebetween.

In an exemplary embodiment, the upper encapsulation layer may include silicon nitride ($SiN_X$).

In an exemplary embodiment, a ratio in number of nitrogen atoms to silicon atoms in the upper encapsulation layer may range from about 0.4 to about 0.6.

In an exemplary embodiment, the lower encapsulation layer may include silicon oxynitride ($SiO_XN_Y$).

In an exemplary embodiment, a ratio in number of oxygen atoms to silicon atoms in the lower encapsulation layer may range from about 0.55 to about 0.75.

In an exemplary embodiment, the lower encapsulation layer may include silicon oxide ($SiO_X$).

In an exemplary embodiment, each of the plurality of inorganic layers may have transmittance of about 80% or lower to light having a wavelength range of about 390-430 nm.

In an exemplary embodiment, the display device may further include an input sensing unit, which is provided to face the light emitting device with the encapsulation member interposed therebetween. The input sensing unit may include a first conductive layer provided on the encapsulation member to include at least one bridge pattern, a second conductive layer provided on the first conductive layer to include a plurality of sensor patterns, and a first interlayered insulating layer interposed between the first conductive layer and the second conductive layer. The bridge pattern may connect adjacent ones of the sensor patterns to each other.

In an exemplary embodiment, an extinction coefficient of the first interlayered insulating layer to light having a wavelength range of about 390-430 nm may range from about 0.0052 to about 0.0085.

In an exemplary embodiment, an extinction coefficient of the first interlayered insulating layer to light having a wavelength range of about 430 nm or longer may be less than or equal to about 0.004.

According to an exemplary embodiment of the inventive concepts, a display device may include a light emitting device, and an encapsulation member provided on the light emitting device to seal the light emitting device, the encapsulation member including an organic layer and at least one inorganic layer. A difference between extinction coefficients of the inorganic layer to first and second lights may be greater than or equal to about 0.003, where the first light has a wavelength range of about 390-430 nm and the second light has a wavelength range of about 540 nm-620 nm.

In an exemplary embodiment, a difference between refractive indices of the inorganic layer to the first and second lights may be smaller than or equal to about 0.04.

In an exemplary embodiment, the inorganic layer may include at least one of silicon nitride ($SiN_X$), silicon oxynitride ($SiO_XN_Y$), or silicon oxide ($SiO_X$).

In an exemplary embodiment, a ratio in number of nitrogen atoms to silicon atoms in the inorganic layer may range from about 0.4 to about 0.6.

In an exemplary embodiment, a ratio in number of oxygen atoms to silicon atoms in the inorganic layer may range from about 0.55 to about 0.75.

According to an exemplary embodiment of the inventive concepts, a display device may include an display member configured to display an image, the display member including a light emitting device, and an encapsulation member provided on the display member to seal the light emitting device. The encapsulation member may include a lower encapsulation layer on the light emitting device, an organic layer on the lower encapsulation layer, and an upper encapsulation layer on the organic layer. Each of the lower and upper encapsulation layers may include a silicon-based material, and an extinction coefficient of each of the lower and upper encapsulation layers to light having a wavelength range of about 390-430 nm may range from about 0.0052 to about 0.0085.

It is to be understood that both the foregoing general description and the following detailed description are exemplary and explanatory and are intended to provide further explanation of the invention as claimed.

BRIEF DESCRIPTION OF THE DRAWINGS

The accompanying drawings, which are included to provide a further understanding of the invention and are incorporated in and constitute a part of this specification, illustrate exemplary embodiments of the invention, and together with the description serve to explain the inventive concepts.

It should be noted that these figures are intended to illustrate the general characteristics of methods, structure and/or materials utilized in certain example embodiments and to supplement the written description provided below. These drawings are not, however, to scale and may not precisely reflect the precise structural or performance characteristics of any given embodiment, and should not be interpreted as defining or limiting the range of values or properties encompassed by example embodiments. For example, the relative thicknesses and positioning of molecules, layers, regions and/or structural elements may be reduced or exaggerated for clarity. The use of similar or identical reference numbers in the various drawings is intended to indicate the presence of a similar or identical element or feature.

DETAILED DESCRIPTION

In the following description, for the purposes of explanation, numerous specific details are set forth in order to provide a thorough understanding of various exemplary embodiments or implementations of the invention. As used herein "embodiments" and "implementations" are interchangeable words that are non-limiting examples of devices or methods employing one or more of the inventive concepts disclosed herein. It is apparent, however, that various exemplary embodiments may be practiced without these specific details or with one or more equivalent arrangements. In other instances, well-known structures and devices are shown in block diagram form in order to avoid unnecessarily obscuring various exemplary embodiments. Further, various exemplary embodiments may be different, but do not have to be exclusive. For example, specific shapes, configurations, and characteristics of an exemplary embodiment may be used or implemented in another exemplary embodiment without departing from the inventive concepts.

Unless otherwise specified, the illustrated exemplary embodiments are to be understood as providing exemplary features of varying detail of some ways in which the inventive concepts may be implemented in practice. Therefore, unless otherwise specified, the features, components, modules, layers, films, panels, regions, and/or aspects, etc. (hereinafter individually or collectively referred to as "elements"), of the various embodiments may be otherwise combined, separated, interchanged, and/or rearranged without departing from the inventive concepts.

The use of cross-hatching and/or shading in the accompanying drawings is generally provided to clarify boundaries between adjacent elements. As such, neither the presence nor the absence of cross-hatching or shading conveys or indicates any preference or requirement for particular materials, material properties, dimensions, proportions, commonalities between illustrated elements, and/or any other characteristic, attribute, property, etc., of the elements, unless specified. Further, in the accompanying drawings, the size and relative sizes of elements may be exaggerated for clarity and/or descriptive purposes. When an exemplary embodiment may be implemented differently, a specific process order may be performed differently from the described order. For example, two consecutively described processes may be performed substantially at the same time or performed in an order opposite to the described order. Also, like reference numerals denote like elements.

When an element, such as a layer, is referred to as being "on," "connected to," or "coupled to" another element or layer, it may be directly on, connected to, or coupled to the other element or layer or intervening elements or layers may be present. When, however, an element or layer is referred to as being "directly on," "directly connected to," or "directly coupled to" another element or layer, there are no intervening elements or layers present. To this end, the term "connected" may refer to physical, electrical, and/or fluid connection, with or without intervening elements. Further, the DR1-axis, the DR2-axis, and the DR3-axis are not limited to three axes of a rectangular coordinate system, such as the x, y, and z-axes, and may be interpreted in a broader sense. For example, the DR1-axis, the DR2-axis, and the DR3-axis may be perpendicular to one another, or may represent different directions that are not perpendicular to one another. For the purposes of this disclosure, "at least one of X, Y, and Z" and "at least one selected from the group consisting of X, Y, and Z" may be construed as X only, Y only, Z only, or any combination of two or more of X, Y, and Z, such as, for instance, XYZ, XYY, YZ, and ZZ. As used herein, the term "and/or" includes any and all combinations of one or more of the associated listed items.

Although the terms "first," "second," etc. may be used herein to describe various types of elements, these elements should not be limited by these terms. These terms are used to distinguish one element from another element. Thus, a first element discussed below could be termed a second element without departing from the teachings of the disclosure.

Spatially relative terms, such as "beneath," "below," "under," "lower," "above," "upper," "over," "higher," "side" (e.g., as in "sidewall"), and the like, may be used herein for descriptive purposes, and, thereby, to describe one elements relationship to another element(s) as illustrated in the drawings. Spatially relative terms are intended to encompass different orientations of an apparatus in use, operation, and/or manufacture in addition to the orientation depicted in the drawings. For example, if the apparatus in the drawings is turned over, elements described as "below" or "beneath" other elements or features would then be oriented "above" the other elements or features. Thus, the exemplary term "below" can encompass both an orientation of above and below. Furthermore, the apparatus may be otherwise oriented (e.g., rotated 90 degrees or at other orientations), and, as such, the spatially relative descriptors used herein interpreted accordingly.

The terminology used herein is for the purpose of describing particular embodiments and is not intended to be limiting. As used herein, the singular forms, "a," "an," and "the" are intended to include the plural forms as well, unless the context clearly indicates otherwise. Moreover, the terms "comprises," "comprising," "includes," and/or "including," when used in this specification, specify the presence of stated features, integers, steps, operations, elements, components, and/or groups thereof, but do not preclude the presence or addition of one or more other features, integers, steps, operations, elements, components, and/or groups thereof. It is also noted that, as used herein, the terms "substantially," "about," and other similar terms, are used as terms of approximation and not as terms of degree, and, as such, are utilized to account for inherent deviations in measured, calculated, and/or provided values that would be recognized by one of ordinary skill in the art.

Various exemplary embodiments are described herein with reference to sectional and/or exploded illustrations that are schematic illustrations of idealized exemplary embodiments and/or intermediate structures. As such, variations from the shapes of the illustrations as a result, for example, of manufacturing techniques and/or tolerances, are to be expected. Thus, exemplary embodiments disclosed herein should not necessarily be construed as limited to the particular illustrated shapes of regions, but are to include deviations in shapes that result from, for instance, manufacturing. In this manner, regions illustrated in the drawings may be schematic in nature and the shapes of these regions may not reflect actual shapes of regions of a device and, as such, are not necessarily intended to be limiting.

Unless otherwise defined, all terms (including technical and scientific terms) used herein have the same meaning as commonly understood by one of ordinary skill in the art to which this disclosure is a part. Terms, such as those defined in commonly used dictionaries, should be interpreted as having a meaning that is consistent with their meaning in the context of the relevant art and should not be interpreted in an idealized or overly formal sense, unless expressly so defined herein.

Figure 1:
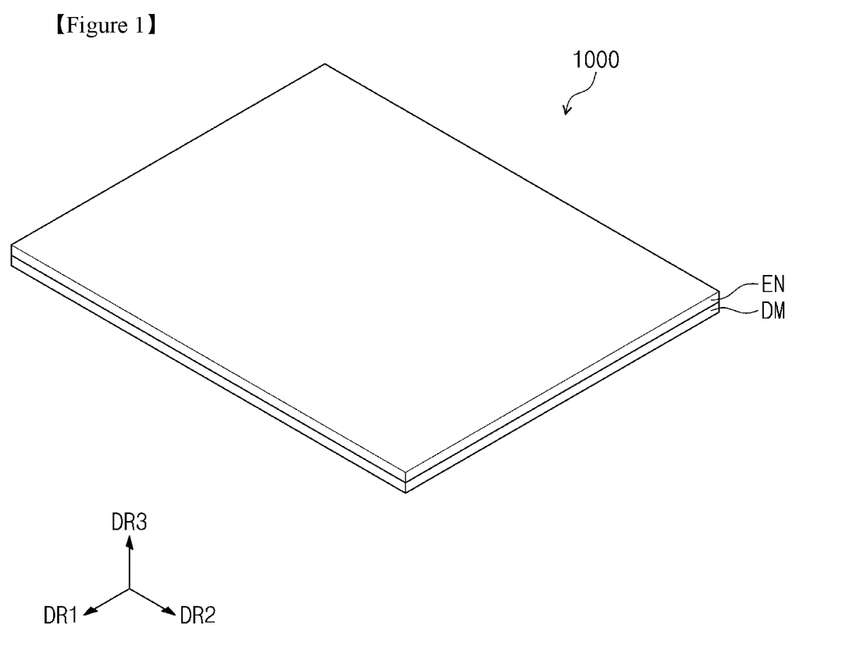
FIG. 1 is a perspective view illustrating a display apparatus according to an exemplary embodiment of the inventive concepts.
Figure 2:
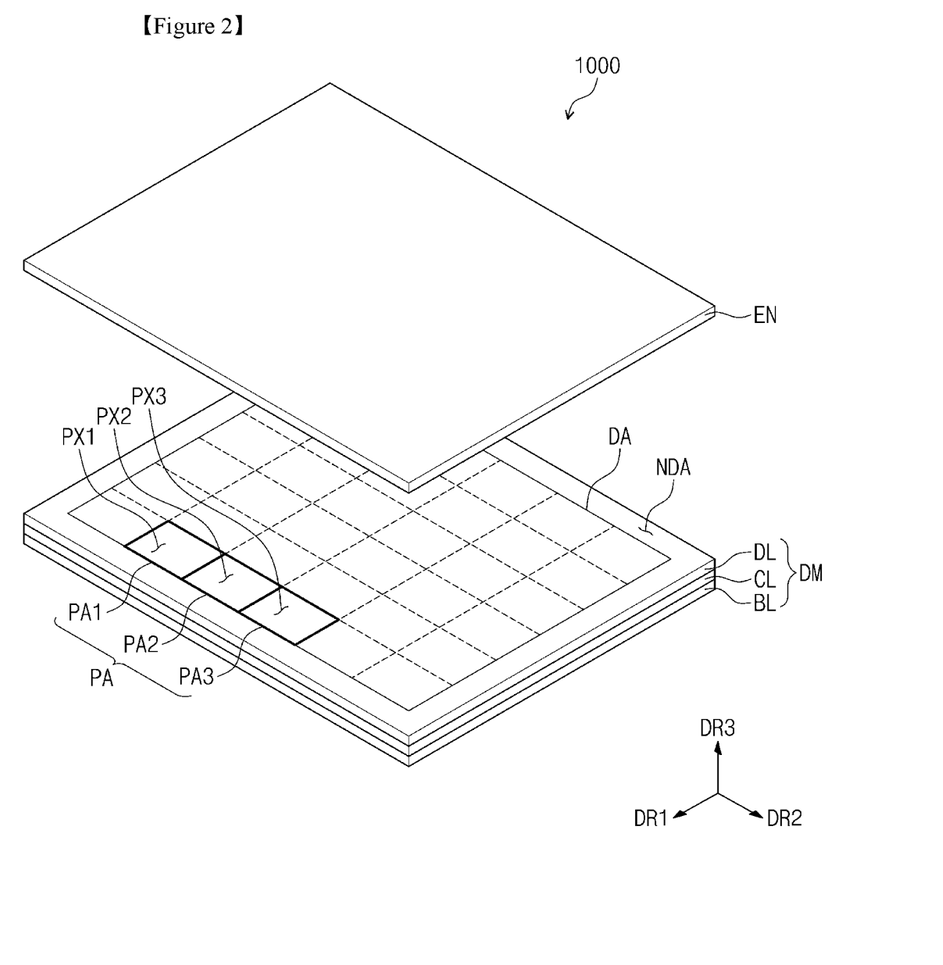
FIG. 2 is an exploded perspective view illustrating a display apparatus according to an exemplary embodiment of the inventive concepts.
Figure 3:
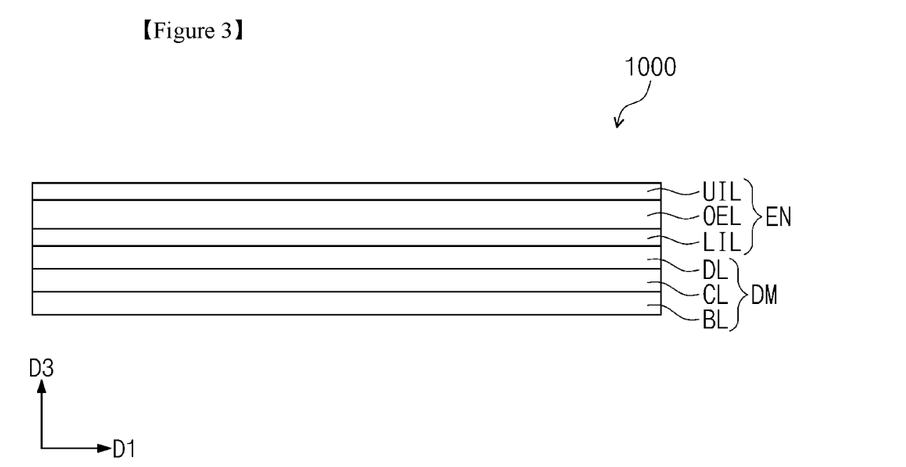
FIG. 3 is a cross-sectional view illustrating a display apparatus of FIG. 1.
Figure 4:
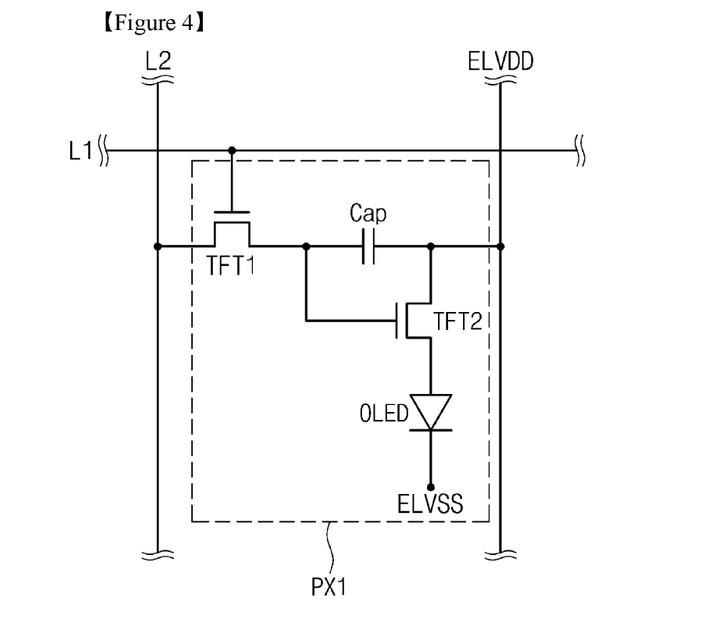
FIG. 4 is a circuit diagram illustrating one of pixels, which are included in a display apparatus according to an exemplary embodiment of the inventive concepts.

FIG. 1 is a perspective view illustrating a display apparatus according to an exemplary embodiment of the inventive concepts, and FIG. 2 is an exploded perspective view illustrating a display apparatus according to an exemplary embodiment of the inventive concepts. FIG. 3 is a cross-sectional view illustrating a display apparatus of FIG. 1, and FIG. 4 is a circuit diagram illustrating one of pixels, which are included in a display apparatus according to an exemplary embodiment of the inventive concepts.

Referring to FIGS. 1 to 4, a display apparatus 1000 according to an exemplary embodiment of the inventive concepts may include a display member DM and an encapsulation member EN.

The display member DM may be configured to display an image in response to an electrical signal applied thereto. For example, the display member DM may be an organic light emitting display panel.

The display member DM may include a display region DA and a non-display region NDA. The display region DA may be configured to display an image. When the display apparatus 1000 is viewed in an image displaying direction, the display region DA may have a roughly rectangular shape, but the inventive concepts are not limited thereto.

The display region DA may include a plurality of pixel regions PA. The pixel regions PA may be arranged in a matrix shape, when viewed in a plan view defined by a first direction DR1 and a second direction DR2. However, the inventive concepts are not limited thereto, and the pixel regions PA may be arranged in various shapes.

Figure 5:
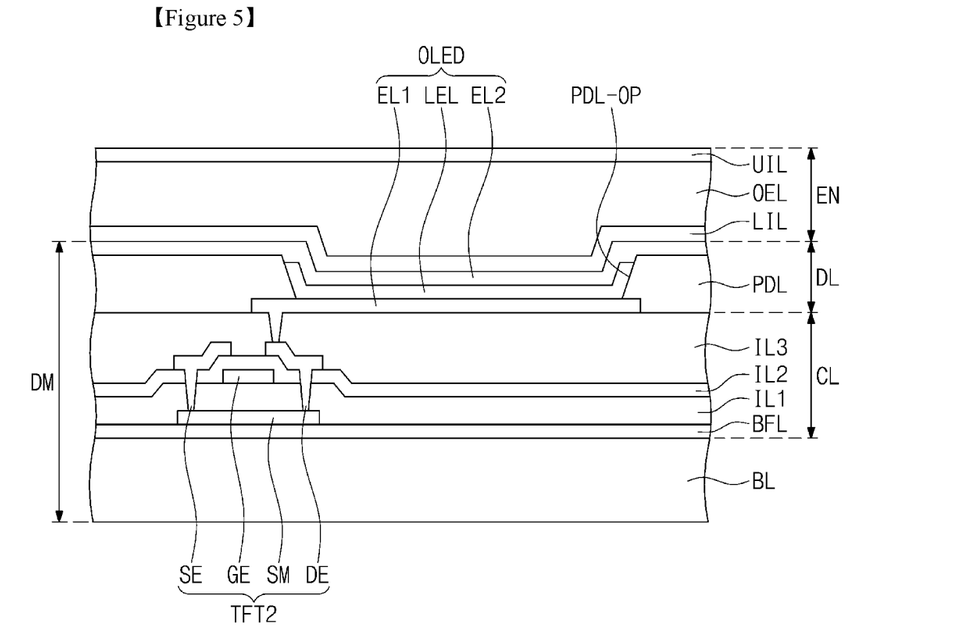
FIG. 5 is a cross-sectional view schematically illustrating a portion of a display apparatus according to an exemplary embodiment of the inventive concepts.

The pixel regions PA may be defined by a pixel definition layer PDL (e.g., see FIG. 5). A plurality of pixels (e.g., PX1-PX3) may be provided in the pixel regions PA, respectively. Each of the pixels PX1-PX3 may include a light emitting device. Each of the pixels PX1-PX3 may include an organic light emitting device OLED (e.g., see FIG. 5). However, the present invention is not limited thereto, and the display device included in the pixels may include various light emitting devices, such as LCD, LED, micro-LED, nano-LED, Quantum dot, a Quantum Rod, or the like. Hereinafter, a case where a display element is an organic light emitting diode OLED will be described as an example.

The plurality of pixels PX1-PX3 may include a first pixel PX1, a second pixel PX2, and a third pixel PX3. The first to third pixels PX1-PX3 may be configured to emit light beams whose colors or wavelengths are different from each other. For example, the first pixel PX1 may be configured to emit a first color light, the second pixel PX2 may be configured to emit a second color light, and the third pixel PX3 may be configured to emit a third color light. Combination of the lights to be emitted from the pixel regions PA may be variously changed to display an image on the display member DM.

The non-display region NDA may not be used to display an image. When the display apparatus 1000 is viewed in an image displaying direction, the non-display region NDA may be provided to surround the display region DA.

In the present exemplary embodiment, a third direction DR3 may be perpendicular to both of the first direction DR1 and the second direction DR2. The third direction DR3 may be referred to as an upward or downward direction below. Hereinafter, front and rear surfaces of each of elements to be described below will be differentiated based on the third direction DR3. However, the directions indicated by the upward and downward directions may be relative, and in certain orthogonal embodiments, they may be changed to indicate other directions.

The display member DM may include a base layer BL, a circuit layer CL, and a display layer DL. The circuit layer CL and the display layer DL may be sequentially provided on the base layer BL. The base layer BL may be a substrate that is formed of an insulating material such as glass, plastic, or quartz. For example, the base layer BL may include a synthetic resin film. The base layer BL may not be particularly limited as long as it is commonly used. A material for the base layer BL may be selected in consideration of various physical or chemical properties, such as mechanical strength, thermal stability, transparency, surface flatness, tractability, and waterproofing property.

The pixels PX1-PX3 may be formed throughout the circuit layer CL and the display layer DL. Each of the pixels PX1-PX3 may be configured to emit light in response to electrical signals applied thereto.

For convenience in illustration, an equivalent circuit diagram of one (e.g., the first pixel PX1) of the pixels PX1-PX3 is exemplarily illustrated in FIG. 4. According to an orthogonal embodiment of the inventive concepts, each of the pixels PX1-PX3 may have a structure corresponding to the first pixel PX1, but the inventive concepts are not limited thereto.

Referring to FIG. 4, the first pixel PX1 may include a first transistor TFT1, a capacitor Cap, a second transistor TFT2, and an organic light emitting device OLED. The first transistor TFT1 may include a control electrode connected to a first signal line L1, an input electrode connected to a second signal line L2, and an output electrode.

The first transistor TFT1 may serve as a switching device of controlling an on/off switching operation of the first pixel PX1. For example, the first transistor TFT1 may be used to transmit a data signal from the second signal line L2 to the capacitor Cap or the second transistor TFT2 or to prevent such transmission of the data signal, in response to a scan signal transmitted through the first signal line L1.

The capacitor Cap may include a first capacitor electrode, which is connected to the first transistor TFT1, and a second capacitor electrode, which is used to receive a first power voltage ELVDD. The capacitor Cap may be configured to store charges, and an amount of the charges stored in the capacitor Cap may be determined by a difference between a voltage corresponding to the data signal, which is transmitted through the first transistor TFT1, and the first power voltage ELVDD.

The second transistor TFT2 may include a control electrode, which is connected to the output electrode of the first transistor TFT1 and the first capacitor electrode of the capacitor Cap, an input electrode, which is used to receive the first power voltage ELVDD, and an output electrode. The output electrode of the second transistor TFT2 may be connected to the organic light emitting device OLED. The second transistor TFT2 may be a driving thin-film transistor for controlling the organic light emitting device OLED.

The second transistor TFT2 may control a driving current flowing through the organic light emitting device OLED, based on an amount of charges stored in the capacitor Cap. A turn-on time of the second transistor TFT2 may be determined depending on an amount of charges stored in the capacitor Cap. In an exemplary embodiment, a voltage, which is supplied to the organic light emitting device OLED through the output electrode of the second transistor TFT2, may be substantially lower than the first power voltage ELVDD.

The organic light emitting device OLED may include a light-emitting material. Color of light to be emitted from the organic light emitting device OLED may be determined depending on the kind of the light-emitting material. In an exemplary embodiment, the color of light to be emitted from the organic light emitting device OLED may be one of red, green, blue, and white.

The encapsulation member EN may be placed on the display member DM. The encapsulation member EN may be provided to cover the display layer DL. The encapsulation member EN may be configured to protect the display layer DL from moisture or a contamination material from the outside.

The encapsulation member EN may include a lower encapsulation layer LIL, an organic layer OEL, and an upper encapsulation layer UIL. The encapsulation member EN will be described in more detail with reference to FIGS. 6 to 8.

FIG. 5 is a cross-sectional view schematically illustrating a portion of a display apparatus according to an exemplary embodiment of the inventive concepts. For convenience in illustration, a region, in which elements constituting the first pixel PX1 shown in FIG. 4 are provided, is exemplarily illustrated in FIG. 5.

Referring to FIG. 5, the circuit layer CL may include a functional layer BFL, a second transistor TFT2, and first to third insulating layers IL1, IL2, and IL3.

The functional layer BFL may be provided on the base layer BL. As an example, the functional layer BFL may be or include a buffer layer, but the inventive concepts are not limited thereto. For example, the functional layer BFL may be or include a barrier layer. The buffer layer may be used to enhance an adhesive strength between the base layer BL and a layer provided on the base layer BL, and the barrier layer may be used to prevent a contamination material from being infiltrated into the layer provided on the base layer BL.

The second transistor TFT2 may include a semiconductor layer SM, a control electrode GE, an input electrode SE, and an output electrode DE. The semiconductor layer SM may be formed of a semiconductor material and may be used as an active layer of the second transistor TFT2. The semiconductor layer SM may be formed of at least one of inorganic or organic semiconductor materials.

The first insulating layer IL1 may be provided on the semiconductor layer SM. The first insulating layer IL1 may be provided to cover the semiconductor layer SM. The first insulating layer IL1 may be formed of or include at least one of organic insulating materials or inorganic insulating materials.

The control electrode GE and the second insulating layer IL2 may be sequentially provided on the first insulating layer IL1. The control electrode GE may be formed to cover a region corresponding to a channel region of the semiconductor layer SM. The input electrode SE and the output electrode DE may be provided on the second insulating layer IL2. The output electrode DE may be connected to the semiconductor layer SM through a contact hole, which is formed to penetrate the first insulating layer IL1 and the second insulating layer IL2.

The third insulating layer IL3 may be provided on the input electrode SE, the output electrode DE, and the second insulating layer IL2. The third insulating layer IL3 may serve as a protection layer of protecting the second transistor TFT2 and may also serve as a planarization layer with a flat top surface.

The display layer DL may include the organic light emitting device OLED. The organic light emitting device OLED may be provided on the third insulating layer IL3 of the circuit layer CL. The organic light emitting device OLED may include a first electrode EL1, a second electrode EL2 provided on the first electrode EL1, and a light emitting layer LEL interposed between the first and second electrodes EL1 and EL2.

The first electrode EL1 may be used as a pixel electrode or a positive electrode. The first electrode EL1 may be a transparent electrode, a transflective electrode, or a reflective electrode. In the case where the first electrode EL1 is the transparent electrode, the first electrode EL1 may be formed of or include a transparent metal oxide (e.g., indium tin oxide (ITO), indium zinc oxide (IZO), zinc oxide (ZnO), or indium tin zinc oxide (ITZO)). In the case where the first electrode EL1 is the transflective or reflective electrode, the first electrode EL1 may be formed of or include at least one of Ag, Mg, Al, Pt, Pd, Au, Ni, Nd, Ir, Cr, compounds thereof, or mixtures thereof.

The second electrode EL2 may be a common electrode or a negative electrode. The second electrode EL2 may be a transparent electrode, a transflective electrode, or a reflective electrode. In the case where the second electrode EL2 is the transparent electrode, the second electrode EL2 may be formed of or include at least one of Li, Ca, LiF/Ca, LiF/Al, Al, Mg, BaF, Ba, Ag, compounds thereof, or mixtures thereof (e.g., a mixture of Ag and Mg), but the inventive concepts are not limited thereto. For example, the second electrode EL2 may be formed of or include indium tin oxide (ITO), indium zinc oxide (IZO), zinc oxide (ZnO), or indium tin zinc oxide (ITZO). In the case where the second electrode EL2 is the transflective or reflective electrode, the second electrode EL2 may be formed of or include at least one of Ag, Mg, Al, Pt, Pd, Au, Ni, Nd, Ir, Cr, Li, Ca, LiF/Ca, LiF/Al, Mo, Ti, compounds thereof, or mixtures thereof (e.g., a mixture of Ag and Mg). In certain exemplary embodiments, the second electrode EL2 may be provided to have a multi-layered structure including a reflective or semi-transparent layer (e.g., of the above material) and a transparent conductive layer (e.g., of indium tin oxide (ITO), indium zinc oxide (IZO), zinc oxide (ZnO), or indium tin zinc oxide (ITZO)).

A pixel definition layer PDL may be placed on the first electrode EL1. For example, the pixel definition layer PDL may be provided to cover a portion of the first electrode EL1 and to expose other portion of the first electrode EL1. The pixel definition layer PDL may be formed of or include at least one of metal-fluoride ion compounds, but the inventive concepts are not limited thereto. For example, the pixel definition layer PDL may be formed of one of metal-fluoride ion compounds, such as LiF, BaF2, and CsF. If the metal-fluoride ion compound is formed to have a thickness larger than a specific thickness, it may have an insulating property.

The pixel definition layer PDL may be provided to define an opening PDL-OP. The opening PDL-OP of the pixel definition layer PDL may define a light-emitting region.

The light emitting layer LEL may be disposed between the first electrode EL1 and the second electrode EL2. For example, the light emitting layer LEL may be provided in the opening PDL-OP of the pixel definition layer PDL. The light emitting layer LEL may be overlapped with a light-emitting region that is defined by the opening PDL-OP of the pixel definition layer PDL.

In addition to the light emitting layer LEL, a plurality of common layers may be further provided between the first electrode EL1 and the second electrode EL2. For example, a hole injection layer, a hole transport layer, a light emitting layer, an electron transport layer, and an electron injection layer may be sequentially stacked between the first electrode EL1 and the second electrode EL2. Furthermore, at least one of a hole prevention layer, a hole buffer layer, an electron prevention layer may be further provided between the first electrode EL1 and the second electrode EL2.

Figure 6:
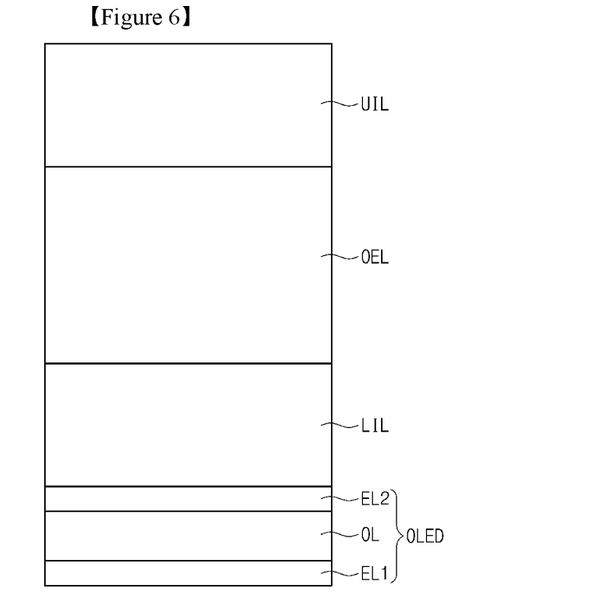
FIG. 6 is an detailed cross-sectional view illustrating an encapsulation member according to an exemplary embodiment of the inventive concepts.

FIG. 6 is a detailed cross-sectional view illustrating an encapsulation member according to an exemplary embodiment of the inventive concepts.

Referring to FIG. 6 in conjunction with FIG. 5, the lower encapsulation layer LIL may be provided on the display layer DL to be in direct contact with the display layer DL. For example, the lower encapsulation layer LIL may be provided to be in contact with the second electrode EL2 of the organic light emitting device OLED. The lower encapsulation layer LIL may be an inorganic layer including an inorganic compound. For example, the lower encapsulation layer LIL may be formed of or include a silicon-based material.

In an exemplary embodiment, the silicon-based material may be at least one of silicon oxynitride ($SiO_XN_Y$), silicon oxide ($SiO_X$), or silicon nitride ($SiN_X$).

In an exemplary embodiment, a ratio in number of oxygen atoms (O) to silicon atoms (Si) in the lower encapsulation layer LIL may range from 0.55 to 0.75.

In an exemplary embodiment, a ratio in number of nitrogen atoms (N) to silicon atoms (Si) in the lower encapsulation layer LIL may range from 0.4 to 0.6.

The lower encapsulation layer LIL may be used as a barrier layer, which encapsulates the organic light emitting device OLED and prevents a contamination material from being infiltrated into the organic light emitting device OLED. In addition, the lower encapsulation layer LIL may have an optically transparent property, and this may make it possible to increase light-emitting efficiency of the organic light emitting device OLED. Although not shown, the lower encapsulation layer LIL may be configured to include a plurality of inorganic thin films.

The organic layer OEL may be provided on the lower encapsulation layer LIL. The organic layer OEL may be formed of or include an organic compound. The organic layer OEL may have a relatively large thickness, compared with neighboring layers. For example, the organic layer OEL may have a thickness larger than that of each of the lower encapsulation layer LIL and the upper encapsulation layer UIL. The organic layer OEL may serve as a protection layer of protecting the organic light emitting device OLED and may also serve as a planarization layer with a flat top surface.

The upper encapsulation layer UIL may be provided on the organic layer OEL. The upper encapsulation layer UIL may be an inorganic layer including an inorganic compound. For example, the upper encapsulation layer UIL may include a silicon-based material. In an exemplary embodiment, the silicon-based material may be silicon nitride ($SiN_X$). In an exemplary embodiment, a ratio in number of nitrogen atoms (N) to silicon atoms (Si) in the upper encapsulation layer UIL may range from 0.4 to 0.6.

The upper encapsulation layer UIL may be provided to cover the organic layer OEL and thereby to prevent the organic layer OEL from being in contact with the outside. In addition, the upper encapsulation layer UIL may be configured to prevent moisture in the organic layer OEL from being leaked to the outside.

Figure 7:
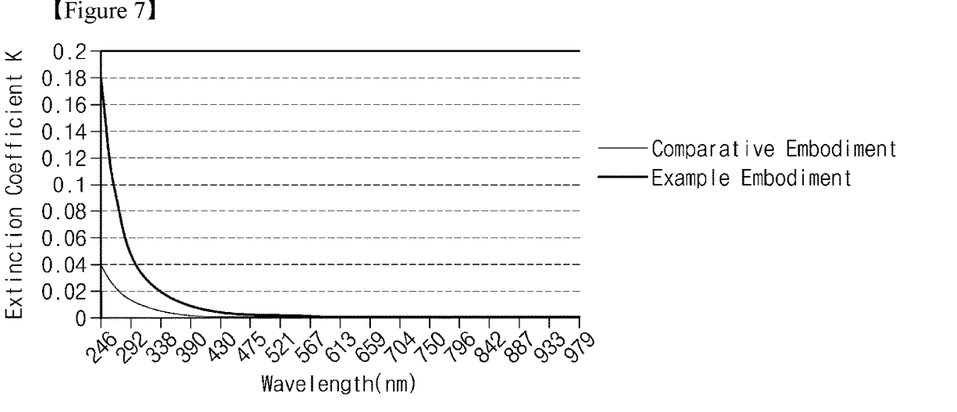
FIG. 7 is a graph showing an extinction coefficient versus wavelength of an upper inorganic layer according to an exemplary embodiment of the inventive concepts.
Figure 8:
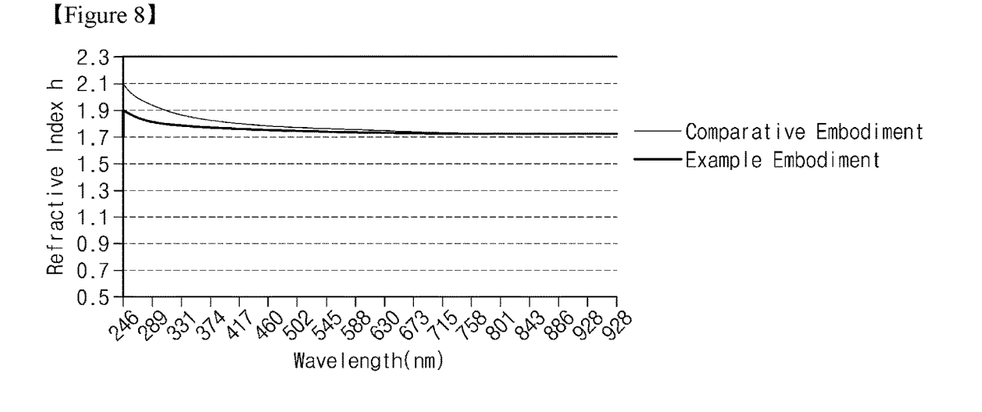
FIG. 8 is a graph showing a refractive index versus wavelength of an upper inorganic layer according to an exemplary embodiment of the inventive concepts.

FIG. 7 is a graph showing an extinction coefficient versus wavelength of each of upper and lower encapsulation layers, according to experimental and comparative embodiments, and FIG. 8 is a graph showing a refractive index versus wavelength of each of upper and lower encapsulation layers, according to experimental and comparative embodiments.

In the experimental and comparative embodiments, the upper encapsulation layer UIL and the lower encapsulation layer LIL may have substantially the same extinction coefficient and refractive index. Thus, for convenience in illustration, an extinction coefficient and a refractive index of one of the inorganic layers (e.g., UIL and LIL) included in the encapsulation member EN are illustrated in FIGS. 7 and 8.

Referring to FIG. 7, an extinction coefficient (k) in a short wavelength region (e.g., at 390 nm) is higher in the inorganic layer of the encapsulation member EN according to the experimental embodiment than in that of the comparative embodiment.

For example, as shown in FIG. 7, the extinction coefficient (k) of each of the inorganic layers UIL and LIL of the encapsulation member EN to light having a wavelength range of about 390-430 nm ranged from about 0.0052 to about 0.0085. The extinction coefficient (k) of each of the inorganic layers UIL and LIL of the encapsulation member EN to light having a wavelength range of about 430 nm or longer was smaller than or equal to about 0.004.

In addition, with regard to a refractive index (n) of each of the inorganic layers UIL and LIL of the encapsulation member EN, the refractive index (n) in a short wavelength region is lower in the experimental embodiment than in the comparative embodiment.

For example, as shown in FIG. 8, the refractive index (n) of each of the inorganic layers UIL and LIL of the encapsulation member EN to light having a wavelength range of about 390-430 nm ranged from about 1.774 to about 1.778. Furthermore, a difference between the refractive index of each of the inorganic layers UIL and LIL to light having a wavelength range of about 390-430 nm and the refractive index of each of the inorganic layers UIL and LIL to light having a wavelength range of about 540 nm-620 nm was equal to or smaller than about 0.04.

That is, each of the inorganic layers UIL and LIL of the encapsulation member EN according to the experimental embodiment had low transmittance in a short wavelength region. For example, each of the inorganic layers UIL and LIL of the encapsulation member EN had transmittance of about 80% or lower to light having a wavelength range of about 390-430 nm.

Unlike the experimental embodiment, in the comparative example where the extinction coefficient (k) of each of the inorganic layers UIL and LIL of the encapsulation member EN to light having a wavelength range of about 390-430 nm was smaller than 0.0052, the light emitting layer LEL of the organic light emitting device OLED may be damaged by a short wavelength light of an external light, which is incident into the display apparatus 1000 from the outside of the display apparatus 1000. In addition, during the process of fabricating the display apparatus 1000, the light emitting layer LEL may be exposed to and damaged by an ultraviolet (UV) light. By contrast, according to an exemplary embodiment of the inventive concepts, each of the inorganic layers UIL and LIL of the encapsulation member EN may have a relatively high extinction coefficient (k) in a short wavelength range, and thus, it may be possible to reduce an amount of a short wavelength light to be incident into the display layer DL. Accordingly, it may be possible to increase life span of the display apparatus 1000.

Furthermore, according to an exemplary embodiment of the inventive concepts, since the extinction coefficient (k) of each of the inorganic layers UIL and LIL of the encapsulation member EN was high in the short wavelength range but was smaller than 0.004 in a wavelength range of 430 nm or longer, light emitting efficiency of light to be generated by the light emitting layer LEL may not be deteriorated. For example, a difference between the extinction coefficient of each of the inorganic layers UIL and LIL to light having a wavelength range of about 390-430 nm and the extinction coefficient of each of the inorganic layers UIL and LIL to light having a wavelength range of about 540 nm-620 nm was equal to or greater than about 0.003. Thus, even if the extinction coefficient (k) is high in the short wavelength range, a display quality of the display apparatus 1000 may not be deteriorated.

Figure 9:
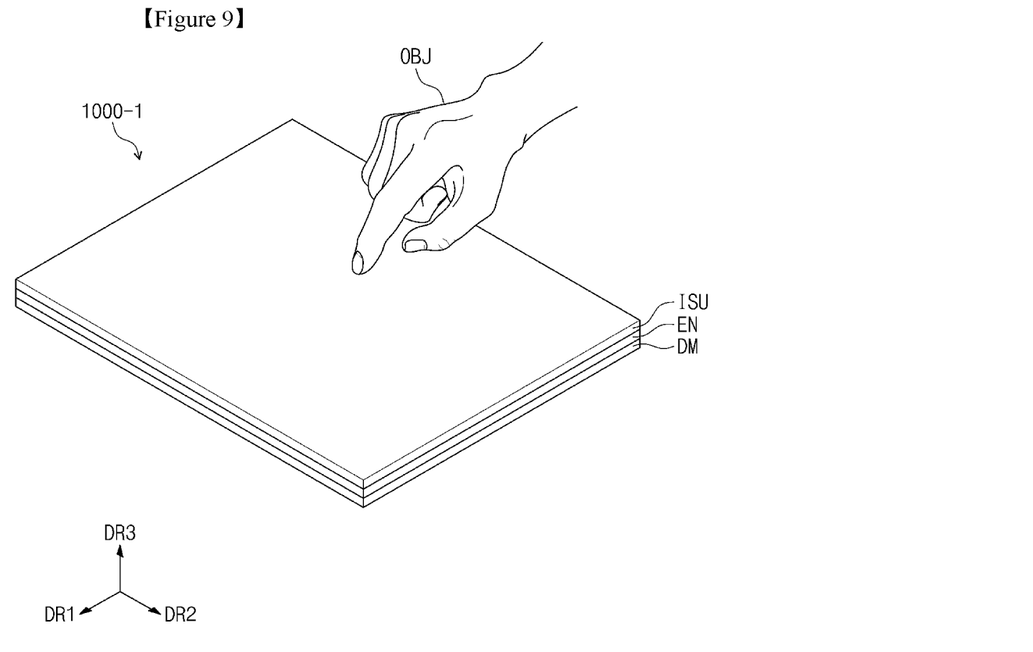
FIG. 9 is a perspective view illustrating a display apparatus according to an exemplary embodiment of the inventive concepts.
Figure 10:
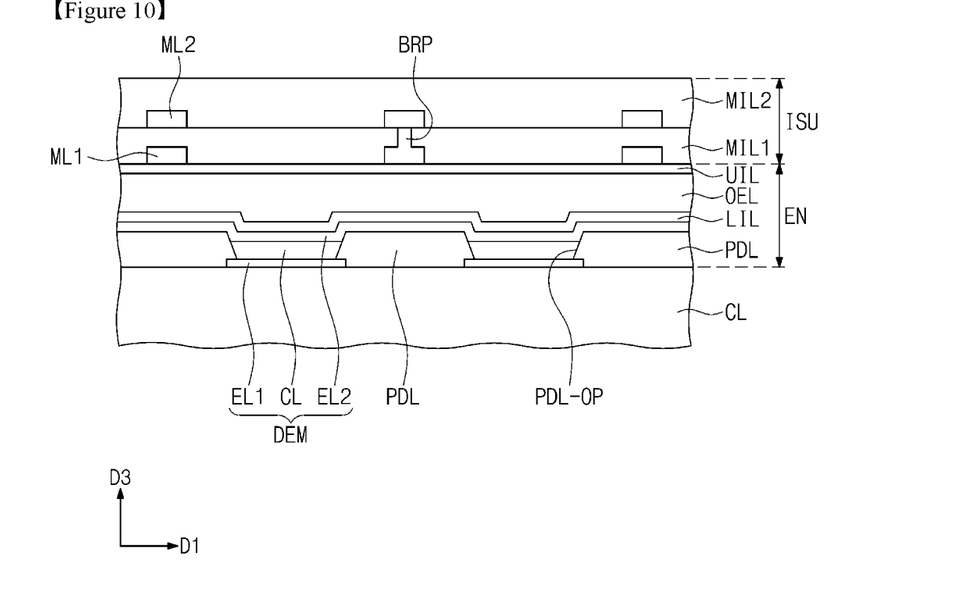
FIG. 10 is a sectional view schematically illustrating a portion of a display apparatus shown in FIG. 9.

FIG. 9 is a perspective view illustrating a display apparatus according to an exemplary embodiment of the inventive concepts, and FIG. 10 is a cross-sectional view schematically illustrating a portion of a display apparatus shown in FIG. 9.

For concise description, a previously described element may be identified by a similar or identical reference number without repeating an overlapping description thereof. Other elements that are not separately described may be configured to have substantially the same technical features as those in the previously described embodiments.

Referring to FIG. 9, a display apparatus 1000-1 may further include an input sensing unit ISU. The input sensing unit ISU may be provided on the encapsulation member EN.

The input sensing unit ISU may have a multi-layered structure. The input sensing unit ISU may include a plurality of sensing electrodes, signal lines connected to the sensing electrodes, and at least one insulating layer. The input sensing unit ISU may be configured to sense an external input in a capacitive sensing manner. However, the inventive concepts are not limited to a specific sensing method of the input sensing unit ISU. For example, in an exemplary embodiment, the input sensing unit ISU may be configured to sense an external input in an electromagnetic induction manner or a pressure-sensing manner.

As shown in FIG. 10, the input sensing unit ISU may include a first conductive layer ML1, a second conductive layer ML2, a first interlayered insulating layer MIL1 and a second interlayered insulating layer MIL2.

The first conductive layer ML1 may be provided on the upper encapsulation layer UIL of the encapsulation member EN. The first conductive layer ML1 may include at least one bridge pattern BRP.

The first interlayered insulating layer MIL1 may be provided on the first conductive layer ML1. In an exemplary embodiment, the first interlayered insulating layer MIL1 may be formed of or include an inorganic layer including a silicon-based material. For example, the silicon-based material may be silicon nitride ($SiN_x$).

The second conductive layer ML2 may be provided on the first interlayered insulating layer MIL1. The second conductive layer ML2 may include a plurality of sensor patterns. For example, each of the sensor patterns may be a sensing electrode.

Each of the bridge patterns BRP may be provided to penetrate the first interlayered insulating layer MIL1 and to connect some of the sensor patterns of the second conductive layer ML2 to each other. The connected sensor patterns may be adjacent to each other, when viewed in a plan view.

The second interlayered insulating layer MIL2 may be provided on the second conductive layer ML2. The second interlayered insulating layer MIL2 may be provided to cover the second conductive layer ML2. In an exemplary embodiment, the second interlayered insulating layer MIL2 may be formed of or include an inorganic layer including a silicon-based material. For example, the silicon-based material may be silicon nitride ($SiN_x$).

In an exemplary embodiment, at least one of the inorganic layers in the first and second interlayered insulating layers MIL1 and MIL2 may be the same as each of the inorganic layers UIL and LIL of the encapsulation member EN in an extinction coefficient (k) and a refractive index (n). For example, in an exemplary embodiment, a ratio in number of nitrogen atoms (N) to silicon atoms (Si) in the first interlayered insulating layer MIL1 may range from about 0.4 to about 0.6. In addition, an extinction coefficient (k) of the first interlayered insulating layer MIL1 to light having a wavelength range of about 390-430 nm may range from about 0.0052 to about 0.0085. An extinction coefficient (k) of the first interlayered insulating layer MIL1 to light having a wavelength range of about 430 nm or longer may be equal to or smaller than about 0.004. A refractive index (n) of the first interlayered insulating layer MIL1 to light having a wavelength range of about 390-430 nm may range from about 1.774 to about 1.778.

According to an exemplary embodiment of the inventive concepts, since at least one of the inorganic layers of the input sensing unit ISU provided on the encapsulation member EN has a high extinction coefficient (k) in a short wavelength range, it may be possible to more effectively prevent the light emitting layer LEL from being damaged by a short wavelength light of light that is incident into the organic light emitting device OLED.

According to an exemplary embodiment of the inventive concepts, it may be possible to improve a display quality of a display apparatus.

Although certain exemplary embodiments and implementations have been described herein, other embodiments and modifications will be apparent from this description. Accordingly, the inventive concepts are not limited to such embodiments, but rather to the broader scope of the appended claims and various obvious modifications and equivalent arrangements as would be apparent to a person of ordinary skill in the art.

What is claimed is:

1. A display apparatus, comprising:
   an organic light emitting device; and
   an encapsulation member provided on the organic light emitting device to seal the organic light emitting device, the encapsulation member including an organic layer and at least one inorganic layer,
   wherein an extinction coefficient of the inorganic layer to light having a wavelength range of about 390-430 nm ranges from about 0.0052 to about 0.0085.

2. The display apparatus of claim 1, wherein an extinction coefficient of the inorganic layer to light having a wavelength range of about 430 nm or longer is less than or equal to about 0.004.

3. The display apparatus of claim 1, wherein a refractive index of the inorganic layer to light having a wavelength range of about 390-430 nm ranges from about 1.774 to about 1.778.

4. The display apparatus of claim 1, wherein the inorganic layer comprises a silicon-based material.

5. The display apparatus of claim 1, wherein the inorganic layer comprises a plurality of inorganic layers,
   the plurality of inorganic layers comprises:
   a lower encapsulation layer between the organic light emitting device and the organic layer; and
   an upper encapsulation layer facing the lower encapsulation layer with the organic layer interposed therebetween.

6. The display apparatus of claim 5, wherein the upper encapsulation layer comprises silicon nitride ($SiN_x$).

7. The display apparatus of claim 6, wherein a ratio in number of nitrogen atoms to silicon atoms in the upper encapsulation layer ranges from about 0.4 to about 0.6.

8. The display apparatus of claim 5, wherein the lower encapsulation layer comprises silicon oxynitride ($SiO_xN_y$).

9. The display apparatus of claim 8, wherein a ratio in number of oxygen atoms to silicon atoms in the lower encapsulation layer ranges from about 0.55 to about 0.75.

10. The display apparatus of claim 5, wherein the lower encapsulation layer comprises silicon oxide ($SiO_x$).

11. The display apparatus of claim 5, wherein each of the plurality of inorganic layers has transmittance of about 80% or lower to light having a wavelength range of about 390-430 nm.

12. The display apparatus of claim 1, further comprising an input sensing unit, which is provided to face the organic light emitting device with the encapsulation member interposed therebetween,
   wherein the input sensing unit comprises:
   a first conductive layer provided on the encapsulation member to include at least one bridge pattern;
   a second conductive layer provided on the first conductive layer to include a plurality of sensor patterns; and
   a first interlayered insulating layer interposed between the first conductive layer and the second conductive layer,
   wherein the bridge pattern connects adjacent ones of the sensor patterns to each other.

13. The display apparatus of claim 12, wherein an extinction coefficient of the first interlayered insulating layer to light having a wavelength range of about 390-430 nm ranges from about 0.0052 to about 0.0085.

14. The display apparatus of claim 13, wherein an extinction coefficient of the first interlayered insulating layer to light having a wavelength range of about 430 nm or longer is less than or equal to about 0.004.

15. A display apparatus, comprising:
    an organic light emitting device; and
    an encapsulation member provided on the organic light emitting device to seal the organic light emitting device, the encapsulation member including an organic layer and at least one inorganic layer,
    wherein a difference between extinction coefficients of the inorganic layer to first and second lights is greater than or equal to about 0.003, where the first light has a wavelength range of about 390-430 nm and the second light has a wavelength range of about 540 nm-620 nm.

16. The display apparatus of claim 15, wherein a difference between refractive indices of the inorganic layer to the first and second lights is smaller than or equal to about 0.04.

17. The display apparatus of claim 15, wherein the at least one inorganic layer comprises at least one of silicon nitride ($SiN_x$), silicon oxynitride ($SiO_xN_y$), or silicon oxide ($SiO_x$).

18. The display apparatus of claim 17, wherein a ratio in number of nitrogen atoms to silicon atoms in the inorganic layer ranges from about 0.4 to about 0.6.

19. The display apparatus of claim 17, wherein a ratio in number of oxygen atoms to silicon atoms in the inorganic layer ranges from about 0.55 to about 0.75.

20. A display apparatus, comprising:
    an display member configured to display an image, the display member including an organic light emitting device; and
    an encapsulation member provided on the display member to seal the organic light emitting device,
    wherein the encapsulation member comprises:
    a lower encapsulation layer on the organic light emitting device;
    an organic layer on the lower encapsulation layer; and
    an upper encapsulation layer on the organic layer,
    wherein each of the lower and upper encapsulation layers comprises a silicon-based material, and an extinction coefficient of each of the lower and upper encapsulation layers to light having a wavelength range of about 390-430 nm ranges from about 0.0052 to about 0.0085.

* * * * *